United States Patent
Tan et al.

(10) Patent No.: US 9,786,865 B2
(45) Date of Patent: *Oct. 10, 2017

(54) OPTICAL DEVICE

(71) Applicants: PIONEER CORPORATION, Kawasaki-shi, Kanagawa (JP); TOHOKU PIONEER CORPORATION, Tendo-shi, Yamagata (JP)

(72) Inventors: Hiroki Tan, Yonezawa (JP); Yuji Saito, Yonezawa (JP); Masanobu Akagi, Yonezawa (JP); Kenichi Okuyama, Yonezawa (JP); Kunihiko Shirahata, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/779,803

(22) PCT Filed: Mar. 25, 2014

(86) PCT No.: PCT/JP2014/058376
§ 371 (c)(1),
(2) Date: Sep. 24, 2015

(87) PCT Pub. No.: WO2014/162933
PCT Pub. Date: Oct. 9, 2014

(65) Prior Publication Data
US 2016/0056407 A1 Feb. 25, 2016

(30) Foreign Application Priority Data
Apr. 1, 2013 (JP) ................. 2013-076004

(51) Int. Cl.
*H01L 51/52* (2006.01)
*H01L 51/00* (2006.01)

(52) U.S. Cl.
CPC ...... *H01L 51/5212* (2013.01); *H01L 51/0037* (2013.01)

(58) Field of Classification Search
None
See application file for complete search history.

(56) References Cited

U.S. PATENT DOCUMENTS 7,601,406 B2 * 10/2009 Garbar .................. C09D 5/24
106/31.33
2005/0053801 A1 3/2005 Elschner et al.
(Continued)

FOREIGN PATENT DOCUMENTS

JP 2004-327829 11/2004
JP 2005-100961 4/2005
(Continued)

OTHER PUBLICATIONS

International Search Report for PCT/JP2014/058376, dated May 13, 2014.

*Primary Examiner* — Lex Malsawma
(74) *Attorney, Agent, or Firm* — Procopio, Cory, Hargreaves & Savitch LLP

(57) ABSTRACT

An optical device includes a joining structure in which a first conductive film (110) and a second conductive film (130) are joined to each other. The first conductive film (110), which constitutes the joining structure, is constituted by a transparent conductive material and the like. The second conductive film (130), which constitutes the joining structure, is constituted by a metal material. A dispersing agent, which is constituted by a material different from the transparent conductive material, exists at a portion of the first conduc- (Continued)

tive film (110) which is located at the periphery of the second conductive film (130).

12 Claims, 13 Drawing Sheets

(56) References Cited

U.S. PATENT DOCUMENTS

| | | | |
|---|---|---|---|
| 2005/0170211 A1 | 8/2005 | Fujioka | |
| 2006/0061270 A1 | 3/2006 | Uhlig et al. | |
| 2008/0129193 A1* | 6/2008 | Asabe | H01L 51/5206 313/504 |
| 2012/0204950 A1* | 8/2012 | Magdassi | C23C 4/18 136/256 |
| 2013/0020564 A1* | 1/2013 | Kobayashi | H01L 27/3283 257/40 |

FOREIGN PATENT DOCUMENTS

| | | |
|---|---|---|
| JP | 2005-216823 | 8/2005 |
| JP | 2006-093123 | 4/2006 |

* cited by examiner

OPTICAL DEVICE

TECHNICAL FIELD

The present invention relates to an optical device that uses an optical element such as a liquid crystal element and an organic EL (electroluminescence) element.

BACKGROUND ART

Optical devices are used as various illuminating devices or displays. Generally, it is necessary for the optical device to have a joining structure that joins different materials such as terminals and interconnections for transmission of an electrical signal that drives the optical element. For example, the organic EL element, which is an example of an optical element, includes a transparent electrode, another electrode that is disposed to face the transparent electrode, and an organic layer that is interposed between the electrodes. As a technology relating to the organic EL element, for example, there is a technology which is described in Patent Document 1.

Patent Document 1 discloses a light-emitting element including an electrode that includes a metal line formed in a linear shape, and a polymer line that is a layered structure of a conductive polymer covering an upper surface and a lateral surface of the metal line.

In addition, Patent Document 2 also discloses a technology of constructing an electrode by using a conductive polymer. Patent Document 2 discloses a semiconductor device which uses a low-resistance portion of an organic conductive material film in which the low-resistance portion and a high-resistance portion are formed through irradiation of energy rays, as an electrode or an ohmic contact.

RELATED DOCUMENT

Patent Document

[Patent Document 1] Japanese Unexamined Patent Application Publication No. 2006-93123
[Patent Document 2] Japanese Unexamined Patent Application Publication No. 2004-327829

SUMMARY OF THE INVENTION

In the joining structure in which a first conductive film and a second conductive film are joined to each other, high contact resistance may occur between the first conductive film and the second conductive film. In this case, connection reliability between the first conductive film and the second conductive film deteriorates, and thus there is a concern that power consumption of the optical device may increase.

As an example, a problem to be solved by the invention is to reduce power consumption of the optical device by improving the connection reliability between two conductive films which are joined to each other.

According to the invention of claim 1, there is provided an optical device including a joining structure in which a first conductive film that is constituted by a conductive material and a second conductive film that is constituted by a metal material are joined to each other. In the joining structure, a dispersing agent that is constituted by a material different from the conductive material exists in a portion of the first conductive film which is located at the periphery of the second conductive film.

BRIEF DESCRIPTION OF THE DRAWINGS

The above and other objects, advantages and features of the present invention will be more apparent from the following description of certain preferred embodiments taken in conjunction with the accompanying drawings.

DESCRIPTION OF EMBODIMENTS

Figure 1:
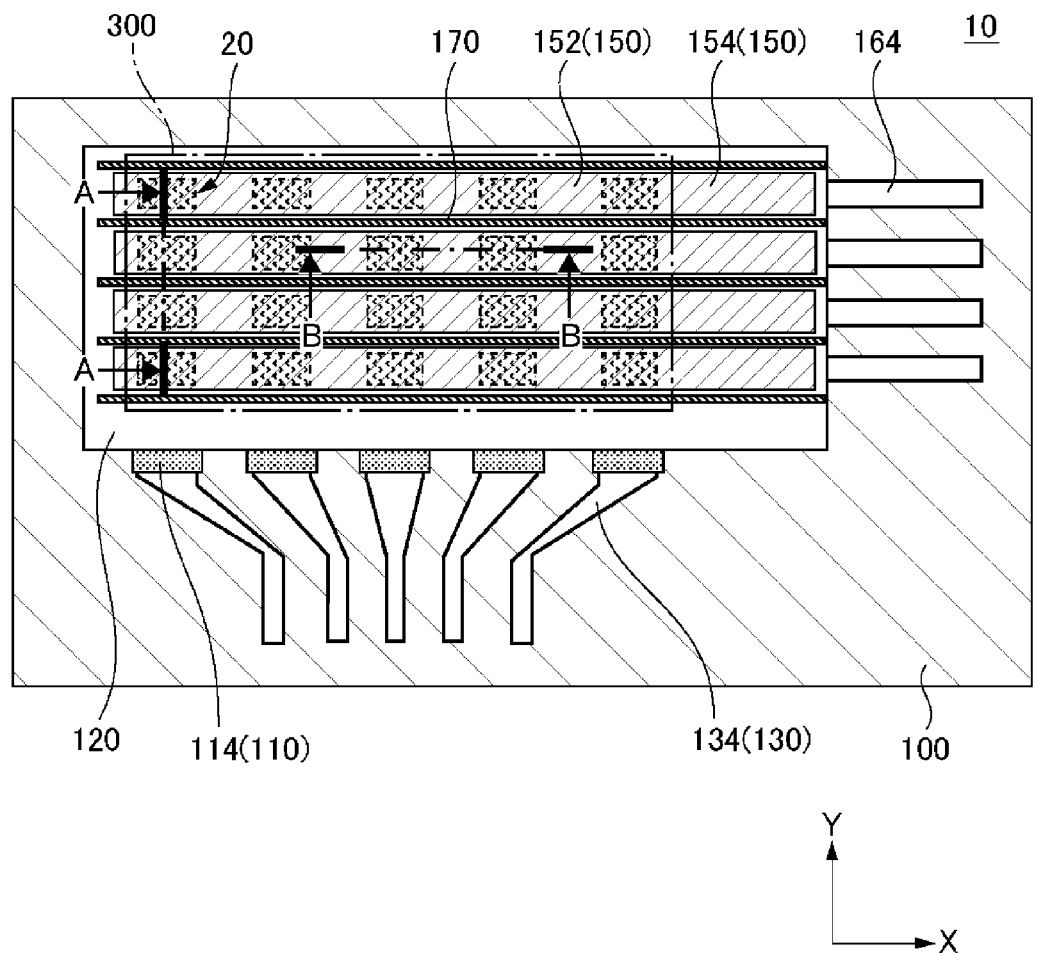
FIG. 1 is a plan view illustrating a light-emitting device according to a first embodiment.

Hereinafter, embodiments of the invention will be described with reference to the accompanying drawings. In all of the drawings, the same reference numerals will be given to the same constituent elements, and description thereof will be appropriately omitted.

First Embodiment

Figure 2:
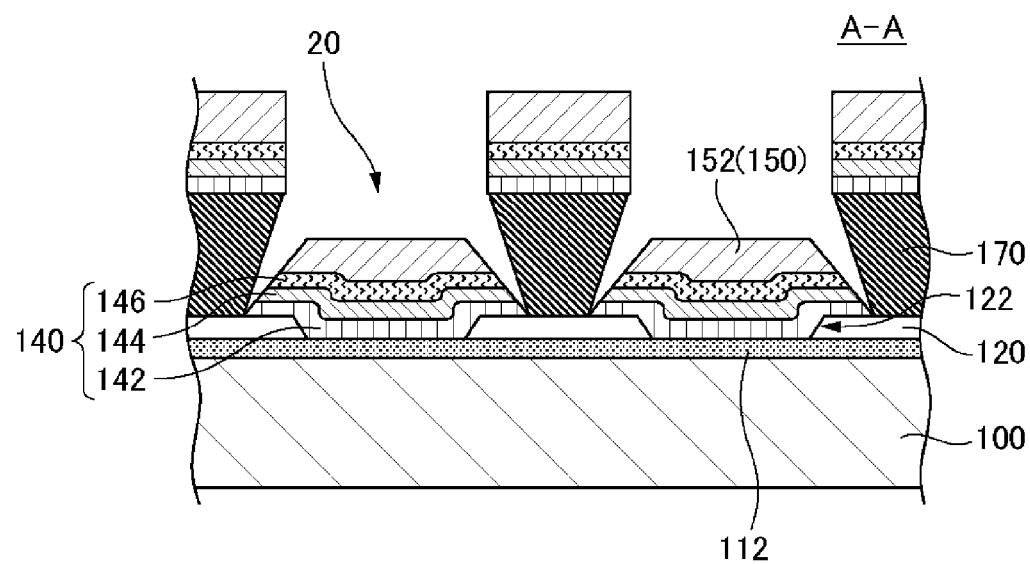
FIG. 2 is a cross-sectional view taken along line A-A in FIG. 1.
Figure 3:
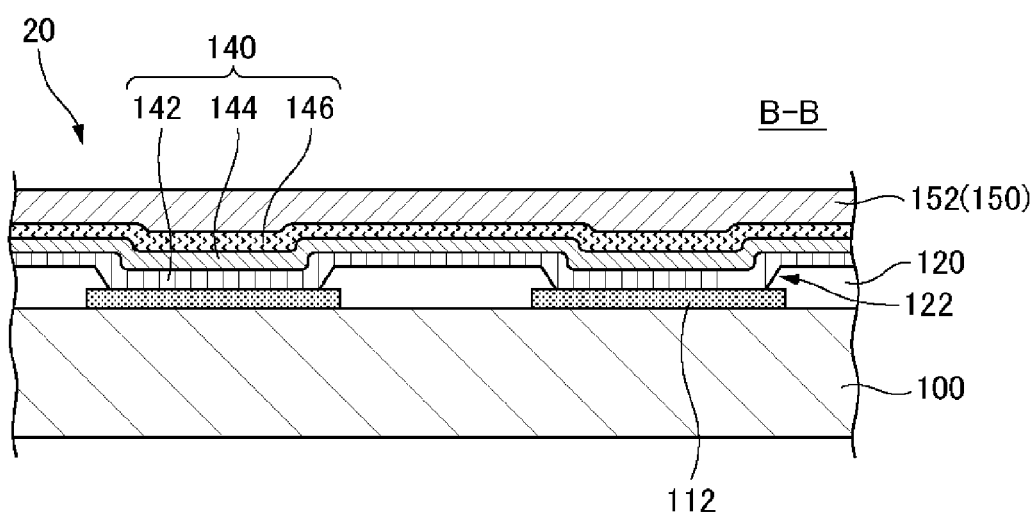
FIG. 3 is a cross-sectional view taken along line B-B in FIG. 1.

FIG. 1 is a plan view illustrating an optical device 10 according to a first embodiment. FIG. 2 is a cross-sectional view taken along line A-A in FIG. 1, FIG. 3 is a cross-sectional view taken along line B-B in FIG. 1.

Figure 4:
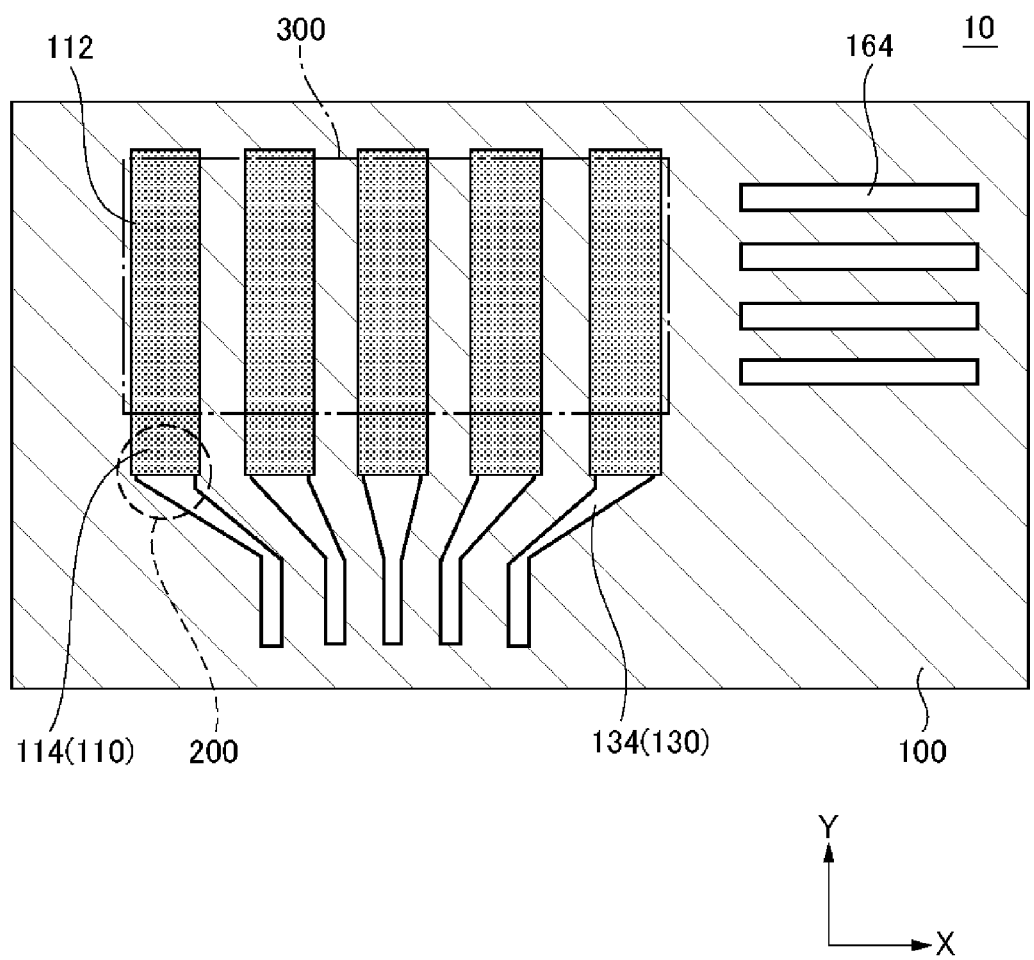
FIG. 4 is a view illustrating a part of the light-emitting device illustrated in FIG. 1.
Figure 5:
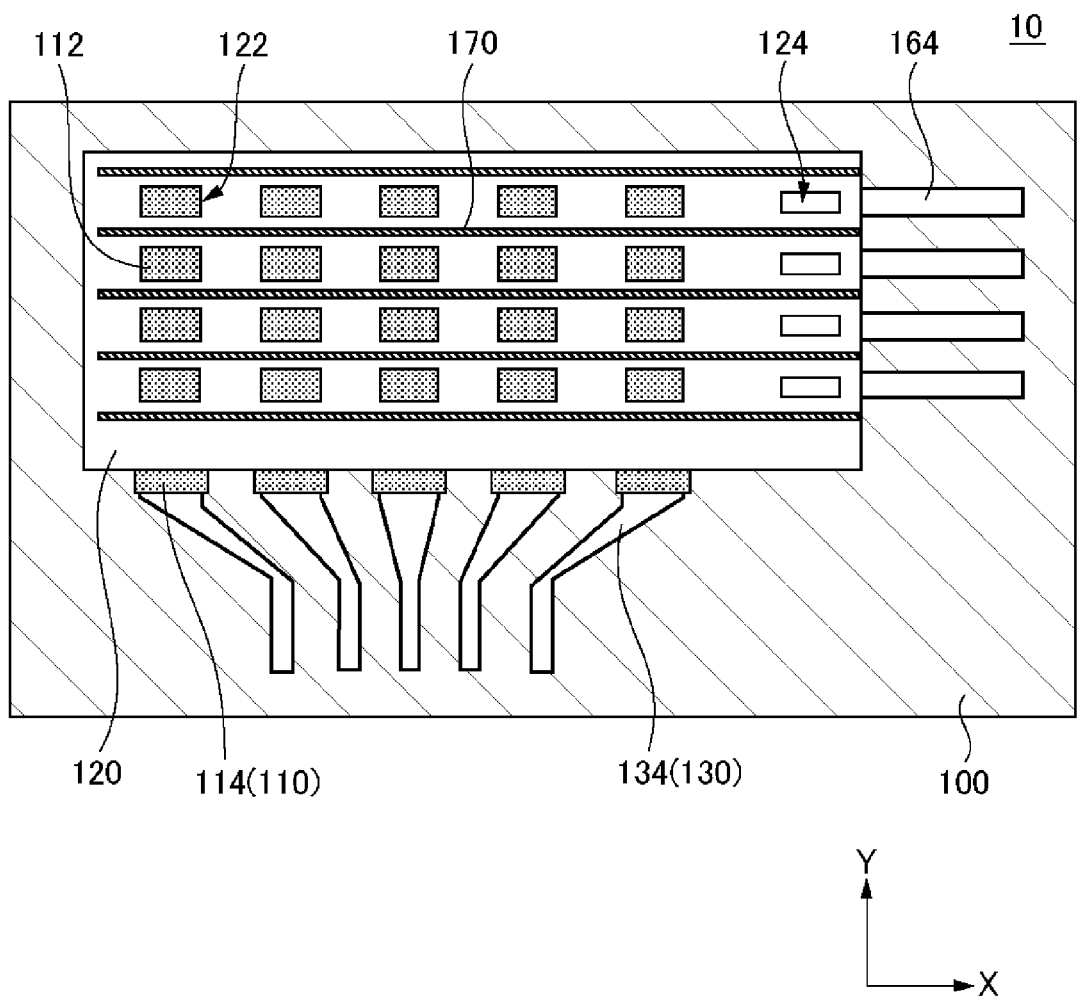
FIG. 5 is a view illustrating a part of the light-emitting device illustrated in FIG. 1.
Figure 6:
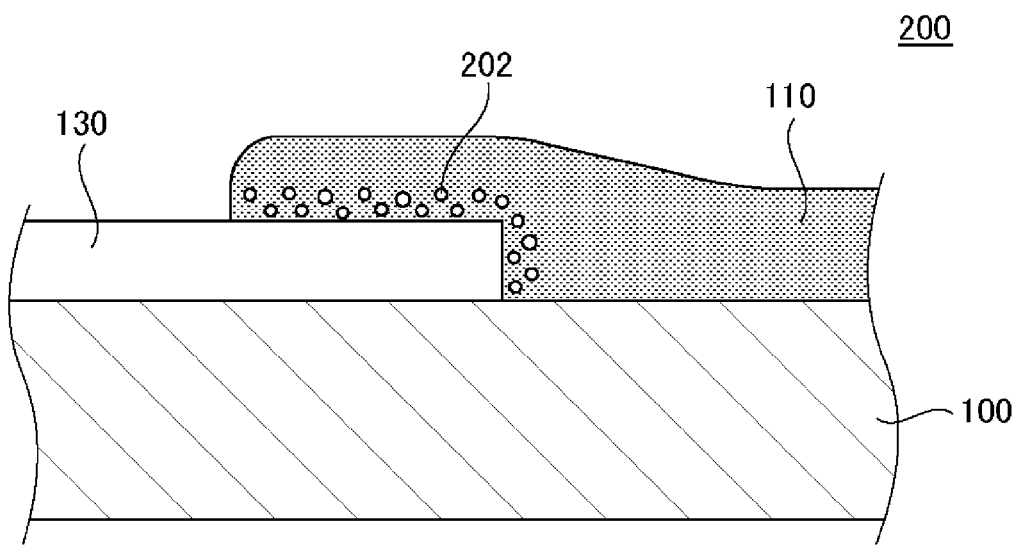
FIG. 6 is a view illustrating an example of a joining structure that is constituted by a first conductive film and a second conductive film in the first embodiment.

In addition, FIGS. 4 and 5 are views illustrating a part of the optical device 10 illustrated in FIG. 1. In FIG. 4, particularly, a positional relationship between a first conductive film 110 and a second conductive film 130 is illustrated. In FIG. 5, particularly, a configuration of an insulating layer 120 is illustrated. FIG. 6 is a view illustrating an example of a joining structure 200 that is constituted by the first conductive film 110 and the second conductive film 130 in this embodiment. In this embodiment, the optical device 10 is, for example, a light-emitting device such as an illuminating device and a display. Hereinafter, description will be given of the optical device 10 as a light-emitting device 10.

The joining structure 200 has a configuration in which the first conductive film 110 constituted by a transparent conductive material and a second conductive film 130 constituted by a metal material are joined to each other. A dispersing agent 202, which is constituted by a material different from a transparent conductive material, exists at a portion of the first conductive film 110 which is located at the periphery of the second conductive film 130.

In addition, the light-emitting device 10 according to this embodiment includes the joining structure 200. The light-emitting device 10 includes an organic EL element 20, a first interconnection 114 and a lead-out interconnection 134. The organic EL element 20 includes a first electrode 112, a second electrode 152, and an organic layer 140 that is disposed between the first electrode 112 and the second electrode 152. The first interconnection 114 is electrically connected to the first electrode 112, and is constituted by the first conductive film 110. The lead-out interconnection 134 is joined to the first interconnection 114, and is constituted by the second conductive film 130.

Hereinafter, an example of a configuration of the light-emitting device 10 according to this embodiment, and an example of a method of manufacturing the light-emitting device 10 will be described in detail.

First, description will be given of an example of a configuration of the joining structure 200 according to this embodiment.

The joining structure 200 is a joining structure in which the first conductive film 110 and the second conductive film 130 are joined to each other. Further, in this specification, the joining between the first conductive film 110 and the second conductive film 130 includes a case where another configuration is interposed between the first conductive film 110 and the second conductive film 130.

In this embodiment, the joining structure 200 is formed, for example, on a substrate 100. In this case, the first conductive film 110 and the second conductive film 130 are formed on the substrate 100.

For example, the joining structure 200 constitutes a light-emitting device that includes an organic EL element. For example, the light-emitting device includes an organic EL element, a first interconnection that is electrically connected to an electrode that constitutes the organic EL element, and a lead-out interconnection that is electrically connected to the first interconnection. At this time, an electrical signal, which controls light-emission and non-light-emission, is supplied to the electrode that constitutes the organic EL element from the outside through the lead-out interconnection and the first interconnection.

In this embodiment, the first conductive film 110 in the joining structure 200 constitutes, for example, the first interconnection that is connected to the electrode that constitutes the organic EL element. In addition, the second conductive film 130 in the joining structure 200 constitutes, for example, a lead-out interconnection. In this case, the joining structure 200 is formed between the first interconnection and the lead-out interconnection. At this time, the dispersing agent 202, which is constituted by a material different from a transparent conductive material, exists at a portion of the first interconnection which is located at the periphery of the lead-out interconnection.

The first conductive film 110 substantially includes a conductive material. Examples of the conductive material, which constitutes the first conductive film 110, include a transparent conductive material, and paste-like conductive material such as silver. Among these, the transparent conductive material is particularly preferable. In a case where the first conductive film 110 is constituted by the transparent conductive material, a conductive film having transparency is obtained. In this embodiment, for example, the first conductive film 110 has a shape that extends in a direction parallel to a plane of the substrate 100.

For example, the transparent conductive material includes an inorganic material such as indium tin oxide (ITO) and indium zinc oxide (IZO), or a conductive polymer.

In a case where the transparent conductive material includes the conductive polymer, the first conductive film 110 can be formed by using a coating method. In this case, in a process of forming the substrate 100, it is possible to suppress a thermal load from being applied to other configurations such as the substrate 100.

In addition, in a case where the inorganic material is included as the transparent conductive material, it is preferable that the first conductive film 110 is a coating-type conductive film that is formed through application of a solution in which the inorganic material is dispersed in an organic solvent. Even in this case, the first conductive film 110 can be formed by using the coating method.

In this embodiment, examples of the conductive polymer, which is included in the transparent conductive material that constitutes the first conductive film 110, include a conductive polymer that includes a n-conjugated conductive polymer and a polyanion. In this case, it is possible to form the first conductive film 110 that is particularly excellent in conductivity, heat resistance, and flexibility.

Although not particularly limited, examples of the n-conjugated conductive polymer that can be used include chain-line conductive polymers such as polythiophenes, polypyrroles, polyindoles, polycarbazoles, polyanilines, polyacetylenes, polyfurans, polyparaphenylene vinylenes, polyazulenes, polyparaphenylenes, polyparaphenylene sulfides, polyisothianaphthenes, and polythiazyls. The polythiophenes or the polyanilines are preferable from the viewpoints of conductivity, transparency, stability, and the like, and polyethylenedioxythiophene is particularly preferable.

Examples of the polyanion, which can be used, include polyvinyl sulfonic acid, polystyrene sulfonic acid, polyallyl sulfonic acid, polyacrylic acid ethyl sulfonic acid, polyacrylic acid butyl sulfonic acid, poly-2-acrylamide-2-methylpropane sulfonic acid, polyisoprene sulfonic acid, polyvinyl carboxylic acid, polystyrene carboxylic acid, polyallyl carboxylic acid, polyacrylic carboxylic acid, polymethacrylic carboxylic acid, poly-2-acrylamide-2-methylpropane carboxylic acid, polyisoprene carboxylic acid, and polyacrylic acid. The polyanions, which can be used in this embodiment, may be homopolymers thereof, or copolymers of two or more kinds thereof.

In a case where the conductive polymer is included as the transparent conductive material that constitutes the first conductive film 110, the transparent conductive material may further contain a cross-linking agent, a leveling agent, a foaming agent, and the like.

The second conductive film 130 includes a metal material. Here, as the metal material that is included in the second conductive film 130, for example, a metal material having electric resistance lower than that of the transparent conductive material that constitutes the first conductive film 110 is used. In this case, the first conductive film 110 and the second conductive film 130 are constituted by materials different from each other.

Examples of the metal material that constitutes the second conductive film 130 include Ag, Al, Cr, Mo, Ni, Nb, Ti, W, Au, Pt, Cu, and Pd. The second conductive film 130 is, for example, a sintered body that is obtained through sintering of metal particles. Further, the second conductive film 130 may be formed by, for example, a sputtering method or a deposition method.

In this embodiment, the first conductive film 110 is formed in such a manner that one end of the first conductive film 110 overlaps a part of the second conductive film 130. In addition, for example, the first conductive film 110 is formed to cover a part of each of an upper surface and a lateral surface of the second conductive film 130.

The dispersing agent 202 exists at a portion of the first conductive film 110 which is located at the periphery of the second conductive film 130. The dispersing agent 202 is constituted by a material different from the transparent conductive material that constitutes the first conductive film 110. In this embodiment, for example, a plurality of the dispersing agents 202 exist at a portion of the first conductive film 110 which is located at the periphery of the second conductive film 130.

In an example illustrated in FIG. 6, the dispersing agent 202 exists at a portion of the first conductive film 110 which is located in the vicinity of the upper surface and the lateral surface of the second conductive film 130.

According to this embodiment, the dispersing agent 202 exists at a portion of the first conductive film 110 which is located at the periphery of the second conductive film 130. According to this, it is possible to reduce contact resistance at the entirety of a joining portion between the first conductive film 110 and the second conductive film 130. According to this, it is possible to suppress concentration of a current to only a part of the second conductive film 130. Accordingly, it is possible to suppress deterioration of connection reliability between the first conductive film 110 and the second conductive film 130 due to the current concentration.

In addition, according to this embodiment, the dispersing agent 202 exists at a portion of the first conductive film 110 which is located at the periphery of the second conductive film 130. According to this, it is possible to mitigate electric field concentration at the joining portion between the first conductive film 110 and the second conductive film 130. In this case, it is possible to suppress occurrence of cracking and the like due to the electric field concentration. The connection reliability between the first conductive film 110 and the second conductive film 130 is also improved from this viewpoint.

For example, the dispersing agent 202 is constituted by an electron-donating or electron-accepting chemical dopant, a metal material, or an oxide thereof. As the chemical dopant that constitutes the dispersing agent 202, for example, a chemical dopant, which increases a carrier density of the first conductive film 110, and improves conductivity, can be used. In addition, examples of the metal material, which constitutes the dispersing agent 202, include Al, Ag, and Cr.

In a case of using the electron-donating or electron-accepting chemical dopant as the dispersing agent 202, the carrier density of the first conductive film 110 is increased, and thus it is possible to improve conductivity of the first conductive film 110. In addition, in a case of using the metal material, a material having electrical resistivity lower than that of the transparent conductive material can be dispersed in the first conductive film 110, and thus it is possible to improve conductivity of the first conductive film 110. Accordingly, when the dispersing agent 202, which is constituted by the material, is allowed to exist at a portion of the first conductive film 110 which is located at the periphery of the second conductive film 130, it is possible to reduce contact resistance between the first conductive film 110 and the second conductive film 130.

In addition, as the dispersing agent 202, for example, a dispersing agent, which is capable of absorbing a line of electric force that occurs in the vicinity of the joining portion between the first conductive film 110 and the second conductive film 130, and has conductivity to a certain extent capable of dispersing an electric field that occurs at the interface, can be used. According to this, it is possible to mitigate electric field concentration at the joining portion between the first conductive film 110 and the second conductive film 130.

Further, in a case where the dispersing agent 202 is constituted by a metal material or an oxide thereof, it is preferable that the metal material that constitutes the dispersing agent 202 and the metal material that constitutes the second conductive film 130 are the same as each other.

The portion of the first conductive film 110, which is located at the periphery of the second conductive film 130, represents a portion of the first conductive film 110 which is located within a predetermined distance from a surface of the second conductive film 130. Further, in this embodiment, the predetermined distance is adjusted to, for example, 100 μm or less. According to this, it is possible to effectively mitigate the electric field concentration at the interface between the first conductive film 110 and the second conductive film 130.

For example, the first conductive film 110 is formed to cover a part of each of the upper surface and the lateral surface of the second conductive film 130. At this time, for example, the dispersing agent 202 exists at a portion of the first conductive film 110 which is located within a predetermined distance from a part of the upper surface of the second conductive film 130 in a direction perpendicular to the upper surface. In addition, for example, the dispersing agent 202 also exists at a portion of the first conductive film 110 within a predetermined distance from a part of the lateral surface of the second conductive film 130 in a direction perpendicular to the lateral surface.

For example, the dispersing agent 202 may exist at portions other than the portion of the first conductive film 110 which is located at the periphery of the second conductive film 130. In this case, it is preferable that a volume occupancy rate of the dispersing agent 202 with respect to a volume of the first conductive film 110 at the portion of the first conductive film 110, which is located at the periphery of the second conductive film 130, is higher than that at other portions of the first conductive film 110. According to this, it is possible to suppress the volume occupancy rate of the dispersing agent 202 at portions other than the portion located at the periphery of the second conductive film 130. That is, it is possible to improve connection reliability between the first conductive film 110 and the second conductive film 130 while maintaining satisfactory transparency at other portions.

For example, the dispersing agent 202 exists at a peripheral region that is located at a distance equal to or less than "d" from the surface of the second conductive film 130. Here, the film thickness of a portion of the first conductive film 110, which overlaps the second conductive film 130, is set as "d". In this embodiment, for example, the dispersing agent 202 exists at the peripheral region that is located at a distance equal to or less than "d" from the upper surface and the lateral surface of the second conductive film 130. Further, the dispersing agent 202 may exist or may not exist at portions of the first conductive film 110 other than the peripheral region. When the dispersing agent 202 exists in the peripheral region, electric field concentration at the joining portion between the first conductive film 110 and the second conductive film 130 is mitigated, and thus it is possible to sufficiently improve connection reliability between the first conductive film 110 and the second conductive film 130.

In addition, from the viewpoint of mitigating the electric field concentration at the interface between the first conductive film 110 and the second conductive film 130, it is preferable that the dispersing agent 202 exists in a region that is located at a distance equal to or less than 2/3×d from the surface of the second conductive film 130.

In this embodiment, for example, the joining structure 200, in which the first conductive film 110 and the second conductive film 130 are joined to each other, is formed as follows.

First, the second conductive film 130 is formed on the substrate 100. The second conductive film 130 is formed by using, for example, a coating method, a sputtering method, or a deposition method. The coating method that is used in the process is not particularly limited and examples thereof include an ink-jet method, a screen printing method, a spray coating method, and a dispenser coating method.

A coating solution, which is used when forming the lead-out interconnection 134 by the coating method includes, for example, a binder resin and an organic solvent. As the binder resin, for example, a cellulose-based resin, an epoxy-based resin, or an acryl-based resin can be used. As the organic solvent, for example, a hydrocarbon-based solvent, or an alcohol-based solvent can be used. In addition, examples of the metal particles, which are contained in the coating solution, include Ag, Al, Cr, Mo, Ni, Nb, Ti, W, Au, Pt, Cu, or Pd.

Next, the first conductive film 110 is formed on the substrate 100. For example, the first conductive film 110 is formed by applying a coating solution that contains the transparent conductive material onto the substrate 100, and drying the coating solution. For example, the first conductive film 110 is formed to cover apart of the second conductive film 130.

The film thickness of the first conductive film 110, which is formed on the substrate 100, is not particularly limited, and for example, is 10 nm to 10 μm or less. In addition, the film thickness of the first conductive film 110 can be appropriately selected in consideration of resistance value, transmittance, cost, and the like. In addition, in the process, although not particularly limited, for example, a coating solution that contains a transparent conductive material is applied onto the substrate 100 by using an ink-jet method, a screen printing method, a letterpress printing method, a gravure printing method, die coating, spin coating, or spraying. The coating solution that contains the transparent conductive material, which is used in the process of forming the first conductive film 110, includes an organic solvent, water, or the like in addition to the above-described transparent conductive material. As the organic solvent, for example, an alcohol-based solvent can be used.

For example, the process of forming the first conductive film 110 is carried out as follows.

First, a coating solution which contains a transparent conductive and in which the dispersing agent 202 is dispersed is selectively applied onto a part of the second conductive film 130. According to this, a first film is formed. Subsequently, the coating solution that contains the transparent conductive material and does not contain the dispersing agent 202 is applied on the substrate 100 in a linear shape so as to cover the first film. According to this, a second film is formed. Further, the second film may be formed by using a coating solution which contains a transparent conductive material and in which the dispersing agent 202 is dispersed in a concentration lower than that in the coating solution for formation of the first film. Subsequently, the first film and the second film are dried. According to this, the first conductive film 110, which is constituted by the first film and the second film, is formed.

In this embodiment, for example, it is possible to form the first conductive film 110 in which the dispersant agent 202 exists at a portion thereof located at the periphery of the second conductive film 130 in this manner.

Next, an example of a configuration of the light-emitting device 10 will be described.

FIG. 1 illustrates a case in which the light-emitting device 10 is a display.

Further, the light-emitting device 10 may be an illuminating device. In a case where the light-emitting device 10 is the illuminating device, for example, the light-emitting device 10 has a configuration in which a plurality of linear organic layers 140 having light emission colors different from each other are repetitively arranged. According to this, an illuminating device, which is excellent in color rendering properties, is realized. In addition, the light-emitting device 10, which is the illuminating device, may include a sheet-shaped organic layer 140.

For example, the substrate 100 is a transparent substrate. In this embodiment, the substrate 100 may be configured as a glass substrate. According to this, it is possible to manufacture the light-emitting device 10 excellent in heat resistance and the like at a low cost.

The substrate 100 may be a film-shaped substrate that is constituted by a resin material. In this case, particularly, it is possible to realize a display with high flexibility. Examples of the resin material that constitutes the film-shaped substrate include polyethylene terephthalate, polyethylene naphthalate, and polycarbonate. In addition, the substrate 100 may be a combination of glass and a resin material. According to this embodiment, even when the optical device (light-emitting device 10) has flexibility, connection reliability in the joining structure 200 constituted by the first conductive film 110 and the second conductive film 130 is high, and thus an effect of reducing power consumption is high.

For example, the light-emitting device 10, which is a display, includes a plurality of the organic EL elements 20 which are arranged in an array shape on the substrate 100. Each of the organic EL elements 20 includes the first electrode 112 that is provided on the substrate 100, the organic layer 140 that is provided on the first electrode 112, and the second electrode 152 that is provided on the organic layer 140. At this time, the organic layer 140 is interposed between the first electrode 112 and the second electrode 152.

In this embodiment, for example, a plurality of the first electrodes 112 which extend in a Y-direction in the drawing, and a plurality of the second electrodes 152 which extend in an X-direction in the drawing are provided on the substrate 100. In addition, the organic EL element 20 is formed at each portion in which each of the first electrodes 112 and each of the second electrodes 152 overlap each other when seen in a plan view. According to this, a plurality of the organic EL elements 20, which are arranged in an array shape, are formed on the substrate 100.

The first electrode 112 becomes, for example, a positive electrode of the organic EL element. In this case, for example, the first electrode 112 becomes a transparent electrode that is transparent or translucent with respect to a wavelength of light emitted from a light-emitting layer 144 of the organic layer 140 to be described later. In addition, for example, on the substrate 100 and within a pixel region 300, the first electrode 112 is provided to extend in a linear shape in the Y-direction in the drawing. In addition, for example, the plurality of first electrodes 112, which are spaced away from each other, are arranged on the substrate 100 in a direction (X-direction in the drawing) perpendicular to the extension direction of the first electrodes 112. At this time, for example, the plurality of first electrodes 112 are electrically separated from each other. Further, the pixel region 300 is a region including the plurality of organic EL elements 20. In an example illustrated in FIG. 4, a region surrounded by a one-dot chain line corresponds to the pixel region 300.

In this embodiment, for example, the first electrode 112 is constituted by a transparent conductive material. As the transparent conductive material that constitutes the first electrode 112, for example, a transparent conductive material, which is the same as the transparent conductive material that constitutes the first conductive film 110, can be used. According to this, the first electrode 112 can have transparency.

For example, the first interconnection 114 is provided on the substrate 100. In this embodiment, a case where the first interconnection 114 is electrically connected to the first electrode 112 is exemplified. At this time, a plurality of the first interconnections 114, which are respectively connected to different ones of the first electrodes 112, are provided on the substrate 100. According to this, each of the plurality of first electrodes 112 in this embodiment is connected to the lead-out interconnection 134 through each of the first interconnections 114.

In this embodiment, the first interconnection 114 is constituted by the first conductive film 110 that is constituted by a transparent conductive material. According to this, the first interconnection 114 can have transparency.

In this embodiment, for example, the first electrode 112 and the first interconnection 114 are integrally provided on the substrate 100. In this case, for example, the first interconnection 114 and the first electrode 112 are constituted by the first conductive film 110. At this time, a portion of the first conductive film 110, which is located in the pixel region 300 including the plurality of organic EL elements 20, becomes the first electrode 112. In addition, a portion of the first conductive film 110, which is located outside the pixel region 300, becomes the first interconnection 114. The first electrode 112 is connected to the lead-out interconnection 134 through the first interconnection 114.

In the example illustrated in FIG. 4, a plurality of first conductive films 110, which extend in the Y-direction in the drawing, are provided on the substrate 100. The plurality of first conductive films 110 are arranged in the X-direction in the drawing so as to be spaced away from each other. In addition, a portion of the first conductive film 110, which is located further on an end side that is connected to the lead-out interconnection 134 than the pixel region 300 indicated by the one-dot chain line, becomes the first interconnection 114.

The lead-out interconnection 134 is provided on the substrate 100.

In this embodiment, a case where the lead-out interconnection 134 and the first interconnection 114 are connected to each other is exemplified. A plurality of the lead-out interconnections 134, which are arranged in the X-direction in the drawing and are spaced away from each other, are provided on the substrate 100. Each of the lead-out interconnections 134 is connected to each of the first interconnections 114. According to this, each of the plurality of first interconnections 114 is connected to the outside through each of the lead-out interconnections 134. A signal for light-emission or non-light-emission is supplied to the organic EL element 20 through the first interconnection 114 and the lead-out interconnection 134.

In this embodiment, the lead-out interconnection 134 is constituted by the second conductive film 130 that is constituted by a metal material. According to this, in a case where the lead-out interconnection 134 and the first interconnection 114 are connected to each other, the first interconnection 114 that is constituted by the first conductive film 110 and the lead-out interconnection 134 that is constituted by the second conductive film 130 are joined to each other, thereby forming the joining structure 200. In the example illustrated in FIG. 4, the joining structure 200 is formed at a portion that is surrounded by a broken line.

The first interconnection 114 is connected to the lead-out interconnection 134 at one end. At this time, for example, the first interconnection 114 and the lead-out interconnection 134 are joined to each other at the one end, thereby forming the joining structure 200. The first interconnection 114 extends in a first direction when seen from the lead-out interconnection 134. Further, the first direction in this embodiment indicates, for example, the Y-direction in the drawing.

The first interconnection 114 is constituted by the first conductive film 110. In addition, the lead-out interconnection 134 is constituted by the second conductive film 130. According to this, the dispersing agent 202 exists at a portion of the first interconnection 114 which is located at the periphery of the lead-out interconnection 134.

In this embodiment, the first interconnection 114 is formed in such a manner that one end of the first interconnection 114 overlaps apart of the lead-out interconnection 134. In addition, for example, the first interconnection 114 is formed to cover a part of each of the upper surface and lateral surface of the lead-out interconnection 134. In this case, for example, the dispersing agent 202 exists at a portion of the first interconnection 114 which is located in the vicinity of the upper surface and the lateral surface of the lead-out interconnection 134.

FIG. 4 illustrates a case where only an end of the lead-out interconnection 134 on a pixel region 300 side overlaps the first interconnection 114 when seen in a plan view. In this case, the end of the lead-out interconnection 134 on the pixel region 300 side is covered with the first interconnection 114 and the other portion is exposed without being covered with the first interconnection 114. In this embodiment, the lead-out interconnection 134 is covered with the first interconnection 114, for example, at a part of the upper surface, an end surface that faces the pixel region 300, and a part of two lateral surfaces which are adjacent to the end surface. In this case, the dispersing agent 202 exists at a portion of the first interconnection 114 which is located in the vicinity of a part of the upper surface, an end surface, and a part of the lateral surface of the lead-out interconnection 134.

For example, the insulating layer 120 is provided on the substrate 100 to cover the first electrode 112. In this embodiment, the insulating layer 120 is provided to cover, for example, a part of each of the first electrode 112, the first interconnection 114, and a lead-out interconnection 164 to be described later.

The insulating layer 120 is a photo-sensitive resin such as a polyimide-based resin, and is formed in a desired pattern through exposure and development. The insulating layer 120 may be constituted by a resin material other than the polyimide-based resin, and may be an epoxy-based resin or an acryl-based resin.

The insulating layer 120 is provided with, for example, a plurality of first openings 122. As illustrated in FIG. 5, the first openings 122 are formed to constitute, for example, a matrix.

In this embodiment, the plurality of first openings 122 are formed to be located on the first electrode 112. On each of the first electrodes 112 which extend in the Y-direction in the drawing, for example, the plurality of first openings 122 are arranged in the Y-direction with a predetermined gap. In addition, for example, the plurality of first openings 122 are provided at a position that overlaps a second electrode 152 that extends in a direction (X-direction in the drawing) orthogonal to the first electrode 112. According to this, the plurality of first openings 122 are arranged to constitute a matrix.

For example, a plurality of second openings 124 are provided in the insulating layer 120.

As illustrated in FIG. 5, for example, the second openings 124 are provided to be located on the lead-out interconnection 164. The plurality of second openings 124 are arranged along one side of a matrix constituted by the first openings 122. When seen in a direction (for example, the Y-direction in the drawing) along the one side, the second openings 124 are disposed at the same interval as the first openings 122.

For example, a partition wall 170 is provided on the insulating layer 120.

As illustrated in FIG. 1, the partition wall 170 is provided to extend in the X-direction in the drawing. That is, the partition wall 170 is formed along an extension direction of the second electrode 152. In addition, a plurality of the partition walls 170 are provided to be arranged in the Y-direction in the drawing.

For example, the partition wall 170 is a photo-sensitive resin such as a polyimide-based resin, and is formed in a desired pattern through exposure and development. Further, the partition wall 170 may be constituted by a resin material other than the polyimide-based resin, and may be an epoxy-based resin or an acryl-based resin.

For example, a cross-section of the partition wall 170 has a shape (inverted trapezoidal shape) in which an upper side and a lower side of a trapezoid are inverted from each other. That is, a width of the upper surface of the partition wall 170 is greater than, for example, a width of a bottom surface of the partition wall 170. In this case, even when collectively forming the plurality of second electrodes 152 by a sputtering method, a deposition method, or the like, it is possible to separate the plurality of second electrodes 152 from each other, each being located between adjacent partition walls 170. Accordingly, it is possible to easily form the second electrodes 152.

Further, a planar shape of the partition wall 170 is not limited to a shape illustrated in FIG. 1. Accordingly, when changing the planar shape of the partition wall 170, it is possible to freely change a planar pattern of the plurality of second electrodes 152 which are separated from each other by the partition wall 170.

As illustrated in FIG. 2, for example, the organic layer 140 is formed in the first openings 122.

In this embodiment, for example, the organic layer 140 is constituted by a stacked body in which a hole injection layer 142, a light-emitting layer 144, and an electron injection layer 146 are sequentially stacked. At this time, the hole injection layer 142 comes into contact with the first electrode 112, and the electron injection layer 146 comes into contact with the second electrode 152. According to this, the organic layer 140 is interposed between the first electrode 112 and the second electrode 152.

Further, a hole transport layer may be formed between the hole injection layer 142 and the light-emitting layer 144, and an electron transport layer may be formed between the light-emitting layer 144 and the electron injection layer 146. In addition, the organic layer 140 may not be provided with the hole injection layer 142.

In this embodiment, for example, the partition wall 170 is provided on the insulating layer 120. In this case, as illustrated in FIG. 2, with regard to the organic layer 140 that is provided in each of a plurality of regions interposed between adjacent partition walls 170, the organic layers 140 are separated from each other in the Y-direction in the drawing. Further, for example, a stacked film, which is constituted by the same material as in the organic layer 140, is formed on the partition wall 170.

On the other hand, as illustrated in FIG. 3, the respective layers, which constitute the organic layer 140, are provided to be continuous over the first openings 122 adjacent to each other in the X-direction in the drawing in which the partition wall 170 extends.

The second electrode 152 is provided on the organic layer 140.

In this embodiment, for example, the second electrode 152 becomes a negative electrode of the organic EL element. For example, the second electrode 152 is provided to extend in a linear shape in the X-direction in the drawing. In addition, for example, a plurality of the second electrodes 152, which are spaced away from each other, are arranged on the substrate 100 in a direction (Y-direction in the drawing) perpendicular to the extension direction of the second electrodes 152.

For example, the second electrode 152 is constituted by a metal material such as tin, magnesium, indium, calcium, aluminum, silver, and alloys thereof. These materials may be used alone or in an arbitrary combination of two or more kinds thereof. Further, in a case where the second electrode 152 is a negative electrode, it is preferable that the second electrode 152 is constituted by a conductive material having a work function that is smaller than that of the first electrode 112 that is a positive electrode.

A second interconnection 154 is provided on the substrate 100.

The second interconnection 154 is connected to either the first electrode 112 or the second electrode 152 which is not connected to the first interconnection 114. According to this, either the first electrode 112 or the second electrode 152, which is connected to the second interconnection 154, is connected to the outside through the second interconnection 154.

In this embodiment, a case where the second interconnection 154 is provided on the organic layer 140 and is connected to the second electrode 152 is exemplified. At this time, a plurality of the second interconnections 154, which are respectively connected to different ones of the second electrodes 152, are provided on the organic layer 140. According to this, each of the plurality of second electrodes 152 in this embodiment is connected to the outside through each of the second interconnections 154. Further, for example, a part of the second interconnection 154 is embedded in the second opening 124, and is connected to the lead-out interconnection 164 to be described later.

For example, the second interconnection 154 is constituted by a metal material. As the metal material that constitutes the second interconnection 154, for example, the same metal material as in the second electrode 152 can be used.

In this embodiment, for example, the second electrode 152 and the second interconnection 154 are integrally provided on the organic layer 140, and constitute a conductive film 150. In this case, a portion of the conductive film 150, which is located in the pixel region 300 including the plurality of organic EL elements 20, becomes the second electrode 152. In addition, a portion of the conductive film 150, which is located outside the pixel region 300, becomes the second interconnection 154. For example, the second electrode 152 is connected to the lead-out interconnection 164 through the second interconnection 154. Further, in an example illustrated in FIG. 1, a region surrounded by a one-dot chain line corresponds to the pixel region 300.

In the example illustrated in FIG. 1, a plurality of the conductive films 150, which extend in the X-direction in the drawing, are provided on the organic layer 140. In addition, the plurality of conductive films 150 are arranged in the Y-direction in the drawing so as to be spaced away from each other. In addition, a portion of each of the conductive films 150, which is located further on an end side that is connected to the lead-out interconnection 164 than the pixel region 300, becomes the second interconnection 154.

For example, the plurality of conductive films 150 are collectively formed on the organic layer 140 by using a sputtering method, a deposition method, and the like. Even in this case, in this embodiment, the partition wall 170 is formed on the insulating layer 120. Accordingly, the conductive films 150 which are provided in a plurality of regions interposed between adjacent partition walls 170 are separated from each other in the Y-direction in the drawing.

According to this, it is possible to form the plurality of conductive films 150 which are arranged in the Y-direction in the drawing to be spaced away from each other and extend in the X-direction in the drawing. At this time, a film that is constituted by the same material as in the conductive film 150 is formed on each of the partition walls 170.

For example, the lead-out interconnection 164 is provided on the substrate 100. The second interconnection 154 is connected to the outside through the lead-out interconnection 164. According to this, the second electrode 152 is connected to the outside through the second interconnection 154 and the lead-out interconnection 164, and a signal is supplied thereto.

For example, the lead-out interconnection 164 is constituted by a metal material. As the metal material that constitutes the lead-out interconnection 164, for example, the same metal material as in the lead-out interconnection 134 can be used. In this case, the lead-out interconnection 164 can be formed simultaneously with the lead-out interconnection 134. According to this, it is possible to suppress an increase in the number of manufacturing processes of the light-emitting device 10. Generally, an end of the lead-out interconnection (134 or 164) forms a terminal portion of the light-emitting device 10. The terminal portion is electrically connected to an external circuit. An anisotropic conductive film (ACF) or a bonding wire is used for connection between the terminal portion and the outer side. Particularly, in the optical device (light-emitting device 10) using the bonding wire, even in a case where the optical device has an irregular or circular shape, in addition to a rectangular shape, connection reliability in the joining structure 200 that is constituted by the first conductive film 110 and the second conductive film 130 is high, and thus an effect of reducing power consumption is high.

Next, description will be give of an example of a method of manufacturing the light-emitting device 10.

First, the lead-out interconnection 134 is formed on the substrate 100. For example, the lead-out interconnection 134 is formed on the substrate 100 by using a coating method, a sputtering method, or a deposition method. Further, in this embodiment, the lead-out interconnection 134 is constituted by the second conductive film 130. According to this, for example, the lead-out interconnection 134 is formed by using a method of forming the above-described second conductive film 130 and a material that constitutes the second conductive film 130.

In addition, in this embodiment, for example, the lead-out interconnection 164 is formed on the substrate 100 simultaneously with the process of forming the lead-out interconnection 134. In this case, for example, the lead-out interconnection 164 is formed by the same method and the same material as in the lead-out interconnection 134.

Next, the first interconnection 114 is formed on the substrate 100. For example, the first interconnection 114 is formed by applying a coating solution that contains a transparent conductive material on the substrate 100, and by drying the coating solution. In addition, in this embodiment, the first interconnection 114 is the first conductive film 110. According to this, the first interconnection 114 is formed by using, for example, a method of forming the above-described first conductive film 110, and a material that constitutes the first conductive film 110.

In the process of forming the first interconnection 114, for example, the first electrode 112 that is connected to the first interconnection 114 is formed together with the first interconnection 114. In this case, for example, the first electrode 112 is formed integrally with the first interconnection 114 to be constituted by the first conductive film 110.

Next, the heat treatment is carried out with respect to the first interconnection 114. According to this, the first interconnection 114 is dried. In a case where the transparent conductive material includes the conductive polymer, when the first interconnection 114 is dried, the cohesive force of the conductive polymer increases, and thus it is possible to form the first interconnection 114 as a strong film. In addition, when the heat treatment is carried out with respect to the first interconnection 114, the first interconnection 114 is cured. In addition, in a case where the transparent conductive material that constitutes the first interconnection 114 includes a photo-sensitive material, the first interconnection 114 may be cured through UV irradiation.

A structure that is obtained at this stage is illustrated in FIG. 4.

Next, the insulating layer 120 is formed on the substrate 100, the first electrode 112, the first interconnection 114, and the lead-out interconnection 164. The insulating layer 120 is patterned into a predetermined shape by using dry-etching, wet-etching, or the like. According to this, the plurality of first openings 122 and the plurality of second openings 124 are formed in the insulating layer 120. At this time, for example, the plurality of first openings 122 are formed in such a manner that a part of the first electrode 112 is exposed from each of the first openings 122.

Next, the partition wall 170 is formed on the insulating layer 120. The partition wall 170 is obtained by patterning the insulating film provided on the insulating layer 120 into a predetermined shape by using dry-etching, wet-etching, or the like. In a case where the partition wall 170 is formed from a photo-sensitive resin, it is possible to allow the partition wall 170 to have an inverted trapezoidal cross-sectional shape by adjusting conditions during exposure and development. A structure that is obtained at this stage is illustrated in FIG. 5.

Next, the hole injection layer 142, the light-emitting layer 144, and the electron injection layer 146 are sequentially formed in the first openings 122. These may be formed by using, for example, a coating method or a deposition method.

According to this, the organic layer 140 is formed.

Next, the conductive film 150, which constitutes the second electrode 152 and the second interconnection 154, is formed on the organic layer 140. At this time, for example, the conductive film 150 is formed in such a manner that a part of the conductive film 150 is located inside the second openings 124. The conductive film 150 is formed by using, for example, a deposition method or a sputtering method.

According to this, the organic EL element 20, which is constituted by the first electrode 112, the second electrode 152, and the organic layer 140 that is interposed between the first electrode 112 and the second electrode 152, is formed on the substrate 100.

In this embodiment, for example, the light-emitting device 10 is formed as described above.

As described above, according to this embodiment, the dispersing agent 202, which is constituted by a material different from the transparent conductive material, exists at a portion of the first conductive film 110 which is located at the periphery of the second conductive film 130. According to this, it is possible to reduce contact resistance at the entirety of the joining portion between the first conductive film 110 and the second conductive film 130. According to this, it is possible to suppress concentration of a current to only a part of the second conductive film 130. Accordingly, it is possible to suppress deterioration of connection reliability between the first conductive film 110 and the second conductive film 130 due to the concentration of a current.

In addition, it is possible to realize the light-emitting device 10 including the first interconnection 114 that is connected to the first electrode 112 constituting the organic EL element 20 and is constituted by the first conductive film 110, and the lead-out interconnection 134 that is constituted by the second conductive film 130. According to this, it is possible to improve connection reliability between the first electrode 112 and the lead-out interconnection 134. In addition, it is possible to improve operation reliability of the light-emitting device 10.

Second Embodiment

Figure 7:
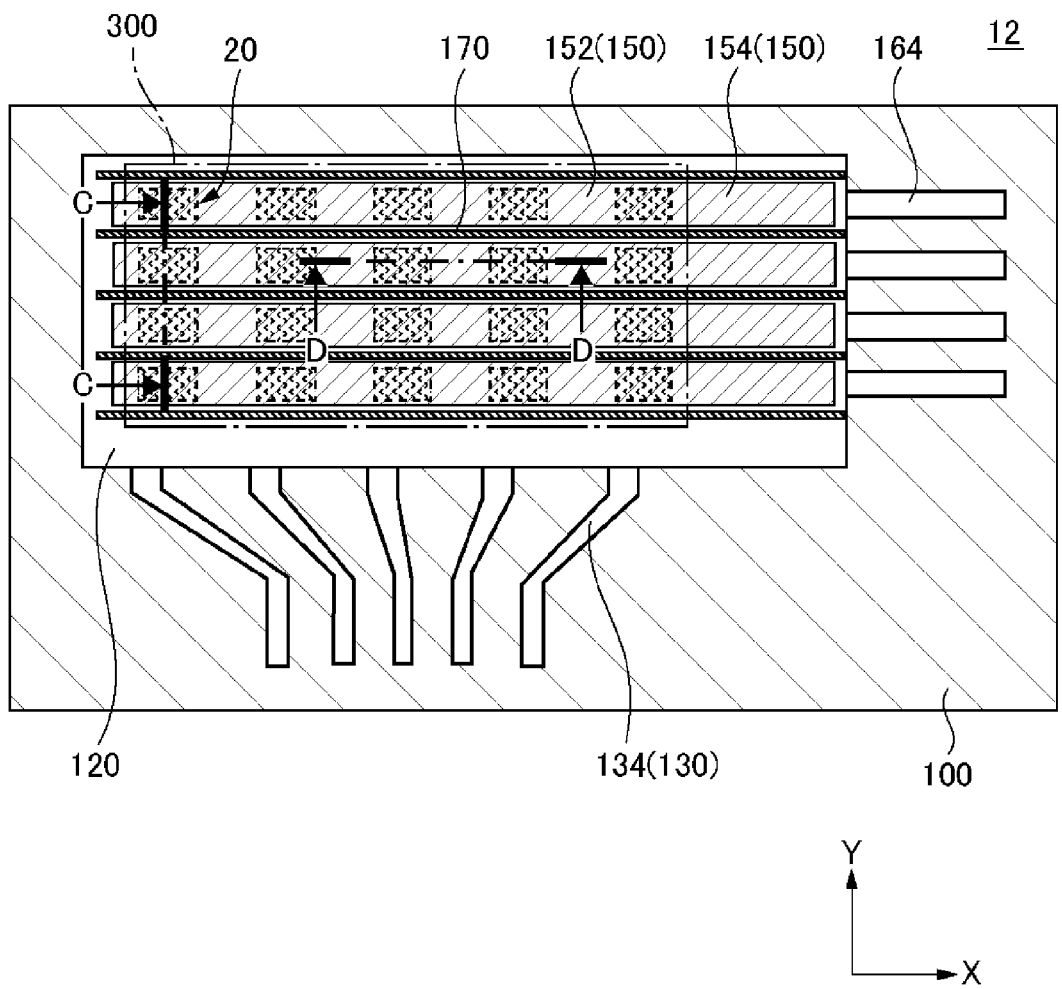
FIG. 7 is a plan view illustrating a light-emitting device according to a second embodiment.
Figure 8:
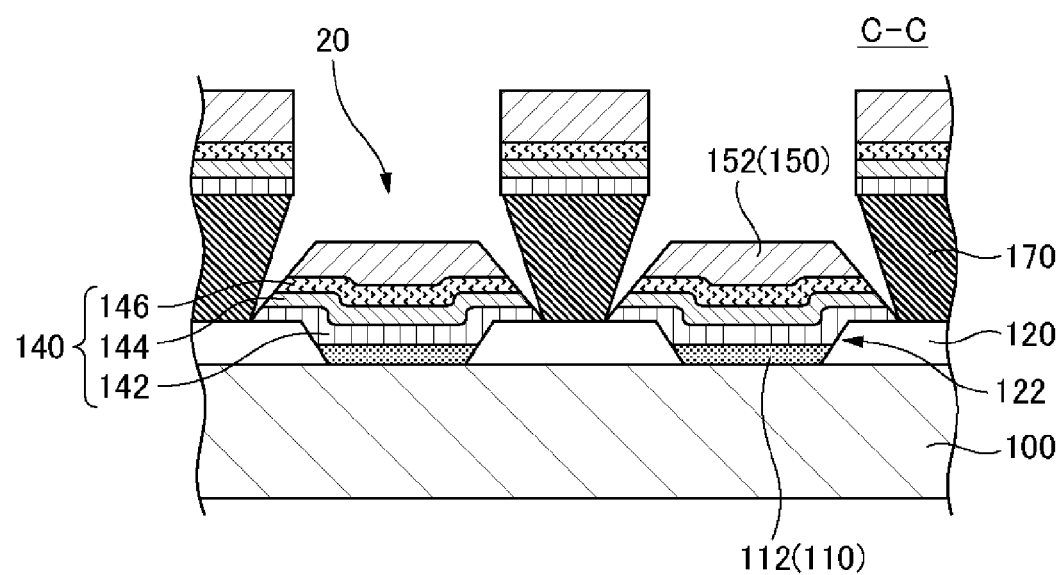
FIG. 8 is a cross-sectional view taken along line C-C in FIG. 7.
Figure 9:
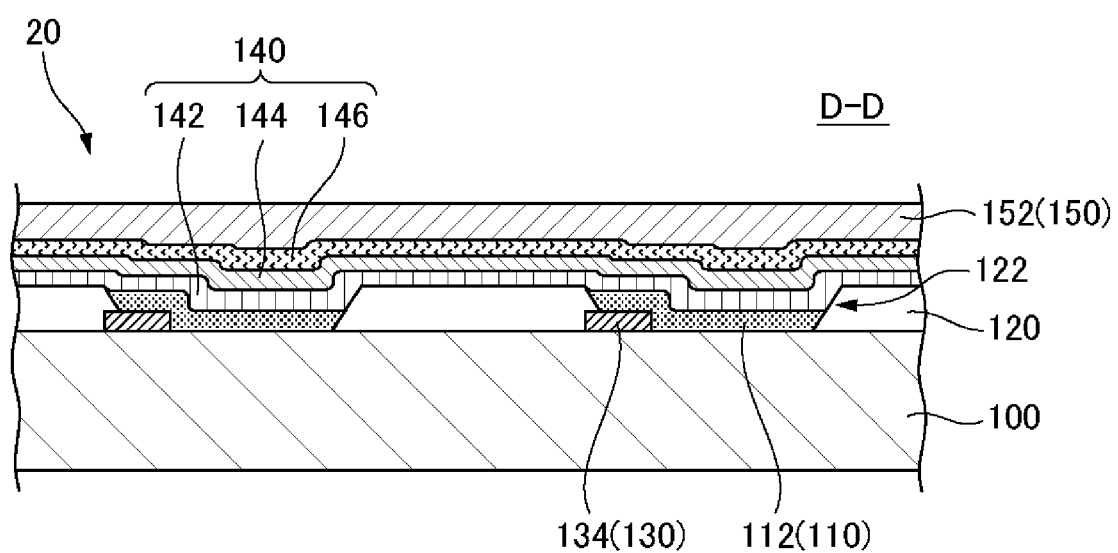
FIG. 9 is a cross-sectional view taken along line D-D in FIG. 7.
Figure 10:
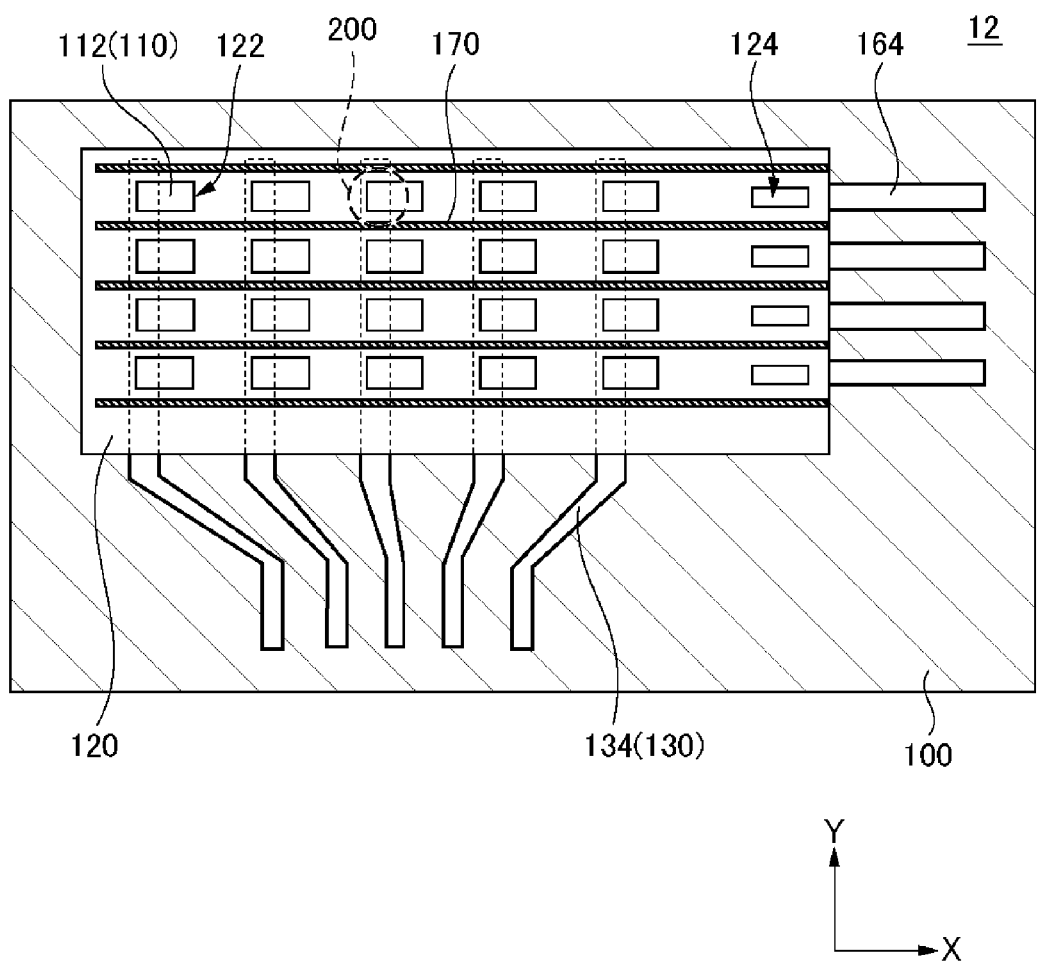
FIG. 10 is a view illustrating a part of the light-emitting device illustrated in FIG. 7.

FIG. 7 is a plan view illustrating a light-emitting device 12 according to a second embodiment, and corresponds to FIG. 1 according to the first embodiment. FIG. 8 is a cross-sectional view taken along line C-C in FIG. 7, and FIG. 9 is a cross-sectional view taken along line D-D in FIG. 7. FIG. 10 is a view illustrating a part of the light-emitting device 12 illustrated in FIG. 7. Particularly, FIG. 10 illustrates a positional relationship between the first conductive film 110 and the second conductive film 130.

In this embodiment, the first conductive film 110 of the joining structure 200 constitutes, for example, an electrode that constitutes the organic EL element. The second conductive film 130 of the joining structure 200 constitutes, for example, a lead-out interconnection that is electrically connected to an electrode that constitutes the organic EL element. In this case, the joining structure 200 is formed between the electrode that constitutes the organic EL element and the lead-out interconnection. In this case, the dispersing agent 202, which is constituted by a material different from the transparent conductive material, exists at a portion of the electrode constituting the organic EL element which is located at the periphery of the lead-out interconnection.

The light-emitting device 12 according to this embodiment has the same configuration as that of the light-emitting device 10 according to the first embodiment except for the configuration of a first electrode 112 and a lead-out interconnection 134.

The light-emitting device 12 includes the joining structure 200. The light-emitting device 12 includes the organic EL element 20 and the lead-out interconnection 134. The organic EL element 20 includes the first electrode 112 that is constituted by the first conductive film 110, the second electrode 152, and the organic layer 140 that is disposed between the first electrode 112 and the second electrode 152. The lead-out interconnection 134 is joined to the first electrode 112, and is constituted by the second conductive film 130.

Hereinafter, description will be given of an example of a configuration of the light-emitting device 12.

In this embodiment, for example, the first electrode 112 is disposed on the substrate 100 in a matrix shape in a pixel region 300. A plurality of the first electrodes 112, which are disposed in a matrix shape, are electrically separated from each other. Further, the pixel region 300 is a region including a plurality of the organic EL elements 20. In an example illustrated in FIG. 7, a region surrounded by a one-dot chain line corresponds to the pixel region 300.

The first electrode 112 is constituted by the first conductive film 110 that is constituted by a transparent conductive material. According to this, the first electrode 112 can have transparency.

The light-emitting device 12 according to this embodiment is not provided with the first interconnection 114 that constitutes the light-emitting device 10 according to the first embodiment.

In this embodiment, a case where the lead-out interconnection 134 is connected to the first electrode 112 is exemplified. The lead-out interconnection 134 extends in the Y-direction in the drawing. In addition, a plurality of the lead-out interconnections 134, which are arranged in the X-direction in the drawing so as to be spaced away from each other, are provided on the substrate 100. Each of the lead-out interconnection 134 is connected to each of a plurality of the first electrodes 112 which are arranged in the Y-direction. According to this, each of the plurality of first electrodes 112 is connected to the outside through each of the lead-out interconnections 134. A signal for light-emission or non-light-emission is supplied to the organic EL element 20 through the lead-out interconnection 134.

In this embodiment, the lead-out interconnection 134 is constituted by the second conductive film 130 that is constituted by a metal material. According to this, the first electrode 112 that is constituted by the first conductive film 110, and the lead-out interconnection 134 that is constituted by the second conductive film 130 are joined to each other, thereby forming the joining structure 200. In an example illustrated in FIG. 10, the joining structure 200 is formed at a portion surrounded by a broken line.

The first electrode 112 is connected to the lead-out interconnection 134 at one end. At this time, for example, the first electrode 112 and the lead-out interconnection 134 are joined to each other at the one end, thereby forming the joining structure 200. As illustrated in FIG. 9, for example, a portion of the lead-out interconnection 134, which is joined to the first electrode 112, is located in a region in which the organic EL element 20 is formed when seen in a plan view.

The first electrode 112 extends in a second direction when seen from the lead-out interconnection 134. Further, the second direction in this embodiment represents, for example, the X-direction in the drawing. The shape of the first electrode 112 is not particularly limited, and can be appropriately selected in combination with the design of the organic EL element 20. Examples of the shape include a rectangular shape.

The lead-out interconnection 134 is provided in such a manner that at least a part thereof overlaps the first electrode 112.

In an example illustrated in FIG. 10, the first electrode 112 is formed in such a manner that one end of the first electrode 112 overlaps a part of the lead-out interconnection 134. In this case, for example, the first electrode 112 is formed to cover a part of each of an upper surface and a lateral surface of the lead-out interconnection 134. At this time, for example, the dispersing agent 202 exists at a portion of the first electrode 112 which is located in the vicinity of the upper surface and the lateral surface of the lead-out interconnection 134.

For example, the insulating layer 120 is formed to cover the lead-out interconnection 134. In this embodiment, for example, the insulating layer 120 is provided to cover apart of each of the lead-out interconnection 134 and a lead-out interconnection 164. In addition, as illustrated in FIG. 10, a plurality of first openings 122 are formed in the insulating layer 120 so as to constitute, for example, a matrix.

In this embodiment, the first electrode 112 is formed in the first openings 122. According to this, a plurality of the first electrodes 112, which are arranged in a matrix shape, are formed on the substrate 100. In addition, as illustrated in FIGS. 8 and 9, the plurality of first electrodes 112 are electrically separated from each other by the insulating layer 120. For example, the first openings 122 are formed to overlap a part of the lead-out interconnection 134 when seen in a plan view. In this case, a part of the lead-out interconnection 134, which overlaps the first openings 122 when seen in a plan view, is connected to the first electrode 112 that is formed in the first openings 122.

For example, the insulating layer 120 is constituted by the same material as in the first embodiment.

For example, the partition wall 170, the organic layer 140, the second electrode 152, the second interconnection 154, and the lead-out interconnection 164 in this embodiment have the same configurations as those in the first embodiment.

As described above, even in this embodiment, it is possible to improve connection reliability between the first conductive film 110 and the second conductive film 130 similar to the first embodiment.

In addition, according to this embodiment, it is possible to realize the light-emitting device 12 including the first electrode 112 that is constituted by the first conductive film 110, and the lead-out interconnection 134 that is constituted by the second conductive film 130. According to this, it is possible to improve connection reliability between the first electrode 112 and the lead-out interconnection 134. In addition, it is possible to improve operation reliability of the light-emitting device 12.

Third Embodiment

Figure 11:
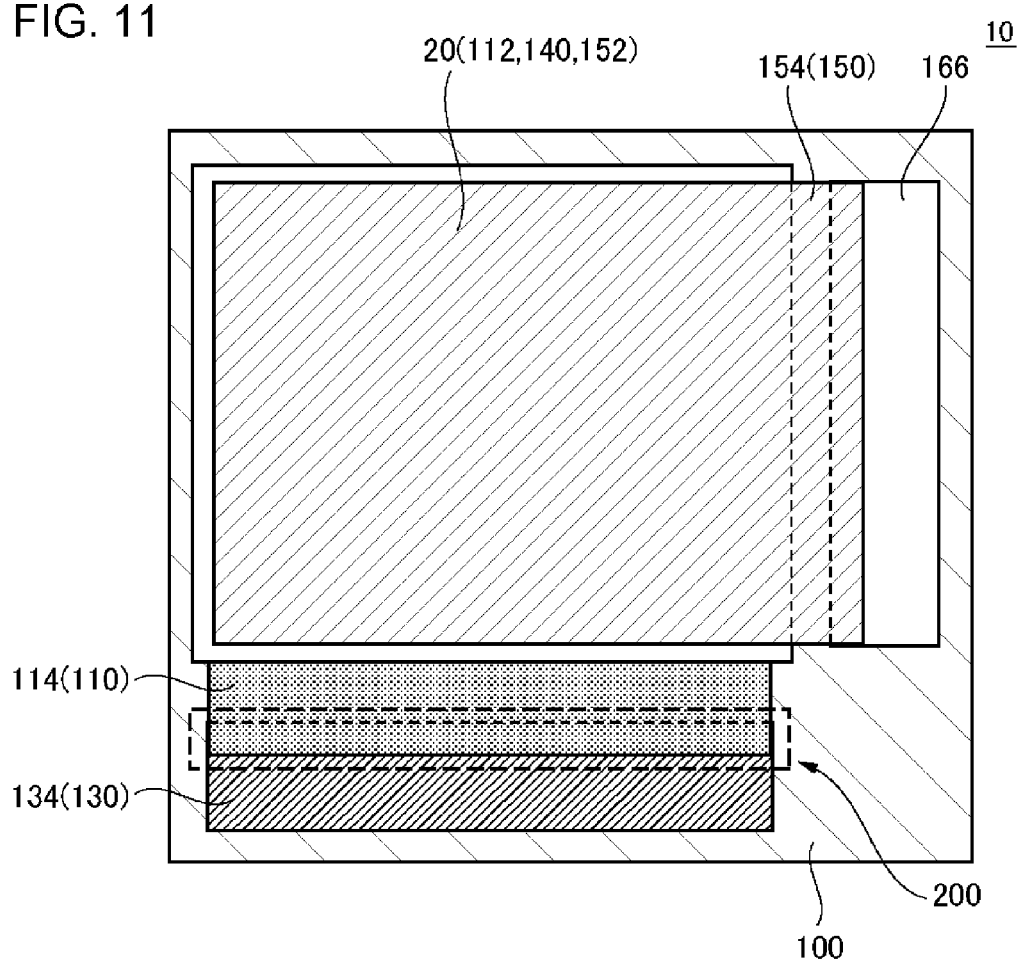
FIG. 11 is a plan view illustrating a configuration of a light-emitting device according to a third embodiment.

FIG. 11 is a plan view illustrating a configuration of a light-emitting device 10 according to a third embodiment. In this embodiment, for example, the light-emitting device 10 is used as a light source of an illuminating device and the like. According to this, the light-emitting device 10 includes one of each of a terminal (end of the lead-out interconnection 134) that is connected to the first electrode 112, and a terminal (end of the lead-out interconnection 166) that is connected to the second electrode 152. In addition, the light-emitting device 10 may include one piece of the organic EL element 20, but may include a plurality of the organic EL elements 20. In the latter case, a current simultaneously flows, and thus the plurality of organic EL element 20 are simultaneously controlled. Further, in any case, the insulating layer 120 (not illustrated in the drawing) surrounds the organic EL element 20 so as to define a region serving as the organic EL element 20.

A connection portion between the lead-out interconnection 134 and the first interconnection 114 is constituted by the joining structure 200 illustrated in the first embodiment. In addition, the lead-out interconnection 166 has the same configuration as that of the lead-out interconnection 134. The lead-out interconnections 134 and 166 have a configuration in which a plurality of conductive layers are stacked. In this case, for example, the lead-out interconnections 134 and 166 has a configuration in which a first layer formed from Mo or a Mo alloy, a second layer formed from Al or an Al alloy, and a third layer formed from Mo or a Mo alloy are stacked in this order.

Next, description will be given of a method of manufacturing the light-emitting device 10 according to this embodiment. First, the lead-out interconnections 134 and 166 are formed on the substrate 100. The lead-out interconnections 134 and 166 are formed by using a sputtering method or a deposition method. Subsequently, the first conductive film 110 is formed. A method of forming the first conductive film 110 is the same as in the first embodiment. At this time, the joining structure 200 is also formed. Subsequently, the insulating layer 120, the organic layer 140, and the conductive film 150 are formed.

Further, the conductive film 150 may be formed by the same method as in the first embodiment, or may be formed by the same method as in the first conductive film 110. In the latter case, a connection portion between the conductive film 150 and the lead-out interconnection 166 also becomes the joining structure 200. In this case, the conductive film 150 corresponds to the first conductive film, and the lead-out interconnection 166 corresponds to the second conductive film.

Even in this embodiment, since the joining structure 200 is formed between the lead-out interconnection 134 and the first interconnection 114, and thus connection reliability between the lead-out interconnection 134 and the first interconnection 114 is improved. In addition, in a case of forming the conductive film 150 by the same method as in the first conductive film 110, the connection portion between the conductive film 150 and the lead-out interconnection 166 also becomes the joining structure 200, and thus connection reliability between the conductive film 150 and the lead-out interconnection 166 is also improved.

Fourth Embodiment

Figure 12:
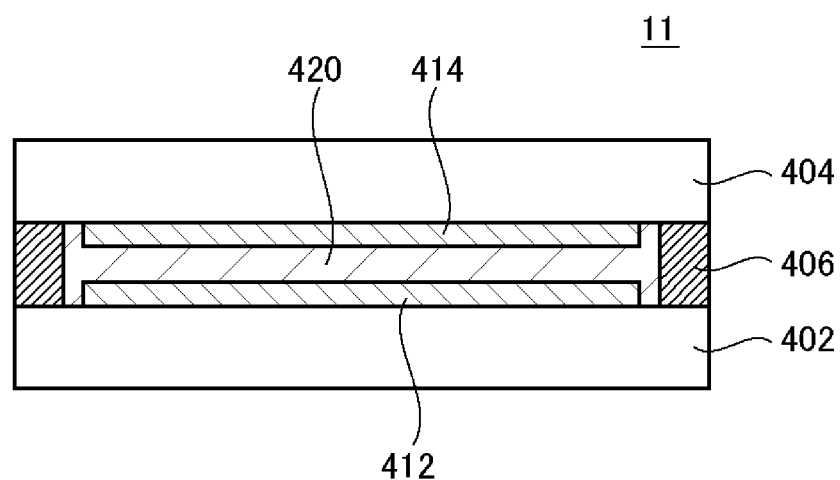
FIG. 12 is a cross-sectional view illustrating a configuration of an optical device according to a fourth embodiment.

FIG. 12 is a cross-sectional view illustrating a configuration of an optical device 11 according to a fourth embodiment. The optical device 11 according to this embodiment is a liquid crystal device, and has a configuration in which a liquid crystal material 420 is interposed between a substrate 402 and a substrate 404.

Specifically, a first electrode 412 is formed on a surface of the substrate 402, which faces the substrate 404, and a second electrode 414 is formed on a surface of the substrate 404 which faces the substrate 402. The first electrode 412 and the second electrode 414 are formed from a transparent conductive material. In addition, a sealing member 406 is provided between the substrate 402 and the substrate 404 so as to surround a space that is filled with the liquid crystal material 420. In other words, the substrate 402 and the substrate 404 are fixed to each other by the sealing member 406. In addition, a space surrounded by the substrates 402 and 404, and the sealing member 406 is filled with the liquid crystal material 420.

Figure 13:
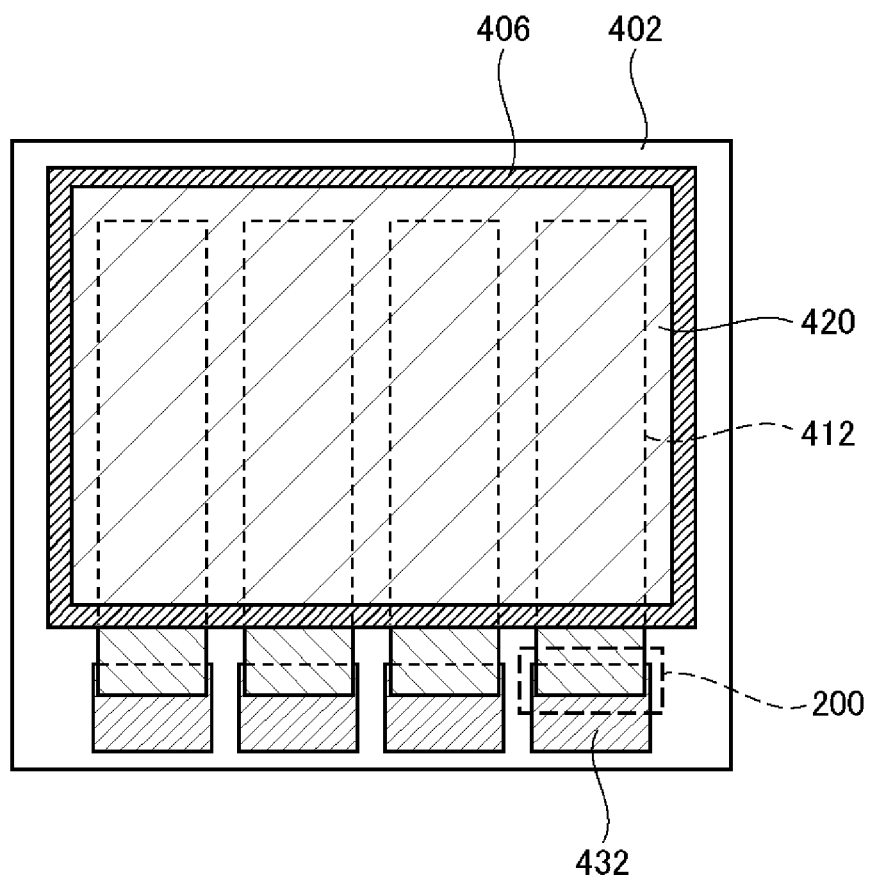
FIG. 13 is a plan view of an optical device.

FIG. 13 is a plan view of the optical device 11. In FIG. 13, the substrate 404 and the second electrode 414 are not illustrated for ease of explanation.

As illustrated in FIG. 13, a plurality of the first electrodes 412 extend on the substrate 402 in parallel with each other. Ends of the plurality of first electrodes 412 are located on an outer side of the sealing member 406, and are respectively connected to different ones of terminals 432. A connection portion between each of the first electrodes 412 and each of the terminals 432 is constituted by the joining structure 200.

Further, a plurality of the second electrodes 414 extend on the substrate 404 in a direction that intersects (for example, a direction that is orthogonal to) the first electrodes 412. In addition, a terminal that is connected to each of the second electrodes 414 is formed on the substrate 404. A connection portion between this terminal and the second electrode 414 is also constituted by the joining structure 200.

According to this embodiment, since the joining structure 200 is also formed between the first electrode 412 and the terminal 432, and between the second electrode 414 and the terminal that is connected to the second electrode 414, connection reliability therebetween is improved.

Hereinafter, the embodiments will be described in detail with reference to Examples. Further, the embodiments are not limited to the description in Examples.

Example 1

First, a metal film formed from silver was formed on a glass substrate by using a sputtering method. Subsequently, the metal film was patterned into a linear shape through dry-etching, thereby forming the second conductive film. Subsequently, a coating solution (hereinafter, referred to as first coating solution) containing a first transparent conductive material, in which silver particles were dispersed, was applied by an ink-jet method so as to cover a part of the second conductive film, thereby forming a first film. Here, as the first coating solution, a solution, which was obtained by dispersing poly(3,4-ethylenedioxythiophene)/polystyrene sulfonate (PEDOT-PSS, CLEVIOS PH510 (manufactured by Heraeus Holding)) in a solvent, was used. In addition, as conductive particles, a silver powder was used. The amount of the silver powder that was introduced into the first coating solution was 1% by weight with respect to a PEDOT/PSS solid content in the first coating solution.

Subsequently, a coating solution (hereinafter, referred to as a second coating solution) containing a second transparent conductive material was applied onto a glass substrate in a linear shape, thereby forming a second film. At this time, the second coating solution was applied in such a manner that the second film covered a part of the first film and the second conductive film. Here, as the second coating solution, a solution, which was obtained by dispersing poly(3,4-ethylenedioxythiophene)/polystyrene sulfonate (PEDOT-PSS, CLEVIOS PH510 (manufactured by Heraeus Holding)) in a solvent, was used. Subsequently, the first film and the second film were dried. According to this, a first conductive film including the first film and the second film, was formed. According to this, a structure including the first conductive film and the second conductive film was prepared.

The structure, which was obtained in this manner, was applied to the light-emitting device according to the first embodiment.

In Example 1, silver particles, which become the dispersing agent, existed at a portion of the first conductive film which was located at the periphery of the second conductive film. In addition, the volume occupancy rate of the dispersing agent with respect to a volume of the first conductive film at a portion of the first conductive film, which was located at the periphery of the second conductive film, was higher than that at other portions of the first conductive film. In Example 1, when a current was allowed to flow between the first conductive film and the second conductive film for a long period of time, the connection reliability between the first conductive film and the second conductive film was excellent.

Comparative Example 1

First, a transparent conductive film formed from ITO was formed on the glass substrate by a sputtering method. Subsequently, the transparent conductive film was patterned in a linear shape through dry-etching, thereby forming the first conductive film. Subsequently, a metal film formed from silver was formed on the first conductive film by using the sputtering method. Subsequently, the metal film was patterned in a linear shape through dry-etching, thereby forming the second conductive film on the first conductive film. According to this, a structure including the first conductive film and the second conductive film was prepared.

In Comparative Example 1, the dispersing agent did not exist at a portion of the first conductive film which was located at the periphery of the second conductive film. In Comparative Example 1, when a current was allowed to flow between the first conductive film and the second conductive film for a long period of time, the connection reliability between the first conductive film and the second conductive film was inferior to the connection reliability in Example 1.

Hereinbefore, embodiments and Examples have been described with reference to the accompanying drawings. However, these are illustrative only, and various configurations other than embodiments and Examples can be employed.

Priority is claimed on Japanese Patent Application No. 2013-076004, filed Apr. 1, 2013, the content of which is incorporated herein by reference.

The invention claimed is:

1. An optical device, comprising:
    a joining structure in which a first conductive film that is constituted by a conductive material and a second conductive film that is constituted by a metal material are joined to each other at an interface where an end of the first conductive film overlaps an end of the second conductive film, such that the first conductive film and the second conductive film only overlap at the interface, and
    an organic EL element comprising a first electrode, a second electrode, and an organic layer positioned between the first electrode and the second electrode, wherein the joining structure is positioned apart from the organic EL element, and the interface is spaced apart from, and does not overlap, the first electrode and the second electrode and the organic layer of the organic EL element;

wherein in the joining structure, a dispersing agent that is constituted by a material different from the conductive material exists in a portion of the first conductive film which is located at the periphery of the second conductive film.

2. The optical device according to claim 1, wherein a volume occupancy rate of the dispersing agent with respect to a volume of the first conductive film at the portion of the first conductive film, which is located at the periphery of the second conductive film, is higher than at other portions of the first conductive film.

3. The optical device according to claim 1, wherein the conductive material includes a conductive polymer.

4. The optical device according to claim 1, wherein the first conductive film is an electrode that constitutes an organic EL element, and the second conductive film is an interconnection that is electrically connected to the electrode.

5. The optical device according to claim 1, wherein the first conductive film is a first interconnection that is connected to an electrode that constitutes the organic EL element, and the second conductive film is a lead-out interconnection that is electrically connected to the first interconnection.

6. The optical device according to claim 1, wherein: the first electrode is constituted by the first conductive film; and further comprising:

a lead-out interconnection that is joined to the first electrode and is constituted by the second conductive film.

7. The optical device according to claim 1, further comprising:

a first interconnection that is electrically connected to the first electrode, and is constituted by the first conductive film; and a lead-out interconnection that is joined to the first interconnection, and is constituted by the second conductive film.

8. The optical device according to claim 1, wherein the dispersing agent comprises an electronic-donating or electron-accepting chemical dopant, a metal material, or an oxide thereof.

9. The optical device according to claim 1, wherein the dispersing agent absorbs a line of electric force that occurs at or near the joining portion, and has conductivity that disperses an electric field that occurs at the joining portion.

10. The optical device according to claim 1, wherein a portion of the first conductive film peripheral to the second conductive film represents a portion of the first conductive film within a distance from a surface of the second conductive film.

11. The optical device according to claim 10, wherein the distance is 100 microns or less.

12. The optical device according to claim 1, wherein the dispersing agent is at a portion of the first conductive film located within a distance of a part of the upper surface or a part of the lateral surface, of the second conductive film in a direction perpendicular to the part of the upper surface or the part of the lateral surface, respectively.

* * * * *